(12) United States Patent
Kim et al.

(10) Patent No.: US 8,471,374 B2
(45) Date of Patent: Jun. 25, 2013

(54) INTEGRATED CIRCUIT PACKAGE SYSTEM WITH L-SHAPED LEADFINGERS

(75) Inventors: Young Cheol Kim, Yongin-si (KR); Koo Hong Lee, Seoul (KR); Jae Hak Yee, Singapore (SG)

(73) Assignee: Stats Chippac Ltd., Singapore (SG)

( * ) Notice: Subject to any disclaimer, the term of this patent is extended or adjusted under 35 U.S.C. 154(b) by 1006 days.

(21) Appl. No.: 11/677,487

(22) Filed: Feb. 21, 2007

(65) Prior Publication Data
US 2007/0194463 A1    Aug. 23, 2007

Related U.S. Application Data

(60) Provisional application No. 60/766,951, filed on Feb. 21, 2006, provisional application No. 60/779,174, filed on Mar. 2, 2006.

(51) Int. Cl.
*H01L 23/3121* (2006.01)
*H01L 24/49* (2006.01)
*H01L 25/0657* (2006.01)

(52) U.S. Cl.
USPC ............. 257/686; 257/77; 438/107; 438/109; 438/127; 438/459; 438/977

(58) Field of Classification Search
USPC ............... 257/692, 777, E23.047, E23.124, 257/E25.023; 438/123
See application file for complete search history.

(56) References Cited

U.S. PATENT DOCUMENTS

| | | | |
|---|---|---|---|
| 5,835,988 A | 11/1998 | Ishii | |
| 6,313,520 B1 * | 11/2001 | Yoshida et al. | 257/676 |
| 6,329,711 B1 | 12/2001 | Kawahara et al. | |
| 6,433,418 B1 | 8/2002 | Fujisawa et al. | |
| 6,476,474 B1 | 11/2002 | Hung | |
| 6,518,655 B2 | 2/2003 | Morinaga et al. | |
| 6,605,866 B1 | 8/2003 | Crowley et al. | |
| 6,630,729 B2 | 10/2003 | Huang | |
| 6,730,544 B1 | 5/2004 | Yang | |
| 6,843,421 B2 | 1/2005 | Chhor et al. | |
| 7,156,633 B2 * | 1/2007 | Bolken et al. | 425/116 |
| 7,235,870 B2 * | 6/2007 | Punzalan, Jr. et al. | 257/685 |
| 7,279,784 B2 | 10/2007 | Liu | |
| 7,550,834 B2 * | 6/2009 | Yu et al. | 257/686 |
| 7,808,093 B2 * | 10/2010 | Kagaya et al. | 257/686 |
| 7,977,782 B2 * | 7/2011 | Camacho et al. | 257/692 |
| 8,053,276 B2 * | 11/2011 | Yu et al. | 438/107 |
| 8,053,880 B2 * | 11/2011 | Yu et al. | 257/686 |
| 8,067,821 B1 * | 11/2011 | Choi et al. | 257/666 |
| 2002/0158316 A1 * | 10/2002 | Lee et al. | 257/676 |
| 2003/0189256 A1 * | 10/2003 | Corisis et al. | 257/777 |
| 2007/0158799 A1 * | 7/2007 | Chiu et al. | 257/678 |

FOREIGN PATENT DOCUMENTS

| | | |
|---|---|---|
| JP | 2001177005 | 6/2001 |
| KR | 1020010064913 A | 7/2001 |
| KR | 1020010064914 A | 7/2001 |

* cited by examiner

*Primary Examiner* — Zandra Smith
*Assistant Examiner* — Tsz Chiu
(74) *Attorney, Agent, or Firm* — Ishimaru & Associates LLP; I-Chang John Yang (57) ABSTRACT

An integrated circuit package system includes a first integrated circuit die having die pads only adjacent a single edge of the first integrated circuit die, forming first L-shaped leadfingers adjacent the single edge, connecting the die pads and the first L-shaped leadfingers, and encapsulating the die pads and portions of the first L-shaped leadfingers to form a first package.

20 Claims, 5 Drawing Sheets

INTEGRATED CIRCUIT PACKAGE SYSTEM WITH L-SHAPED LEADFINGERS

CROSS-REFERENCE TO RELATED APPLICATION(S)

This application claims the benefit of U.S. Provisional Patent Application Ser. No. 60/766,951 filed Feb. 21, 2006 and U.S. Provisional Patent Application Ser. No. 60/779,174 filed Mar. 2, 2006.

TECHNICAL FIELD

The present invention relates generally to integrated circuit package systems, and more particularly to a system for integrated circuit packages with leadfingers.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases. Modern consumer electronics particularly personal portable devices, such as cellular phones, digital cameras, memory cards, MP3 players and other personal music players (PMP), require increasing functions to fit an ever-shrinking physical space.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cell phones, hands-free cell phone headsets, personal data assistants ("PDA's"), camcorders, notebook personal computers, and so forth. All of these devices continue to be made smaller and thinner to improve their portability. Accordingly, large scale integrated circuit ("LSI") packages that are incorporated into these devices are required to be made smaller and thinner, and the package configurations that house and protect them are required to be made smaller and thinner as well.

Many conventional semiconductor die (or "chip") packages are of the type where a semiconductor die is molded into a package with a resin, such as an epoxy molding compound. The packages have a leadframe whose out leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a leadframe), a wire-bonding process (electrically connecting the semiconductor die on the paddle to inner leads using leadframe wires), a molding process (encapsulating a predetermined portion of the assembly, containing the die, inner leads and leadframe wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the ball-grid array ("BGA"). BGA packages typically comprise a substrate, such as a printed circuit board ("PCB"), with a semiconductor die having a multitude of bond pads mounted to the top side of the substrate. Wire bonds electrically connect the bond pads to a series of metal traces on the top side of the PCB. This series of metal traces is connected to a second series of metal traces on the back side of the PCB through a series of vias located around the outer periphery of the PCB. The second series of metal traces each terminates with a contact pad where a conductive solder ball is attached. Typically, the semiconductor die and the wire bonds are encapsulated within a molding compound.

Still thinner, smaller, and lighter package designs and mounting/connecting configurations have been adopted in response to continuing requirements for further miniaturization. At the same time, users are demanding semiconductor packages that are more reliable under increasingly severe operating conditions.

Thus, a need still remains for an integrated circuit package system to lower costs with higher performance, increased miniaturization, and greater packaging densities, to provide and support systems that are capable of achieving optimal thin, high-density footprint semiconductor systems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a first integrated circuit die having die pads only adjacent a single edge of the first integrated circuit die, forming first L-shaped leadfingers adjacent the single edge, connecting the die pads and the first L-shaped leadfingers, and encapsulating the die pads and portions of the first L-shaped leadfingers to form a first package.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 1:
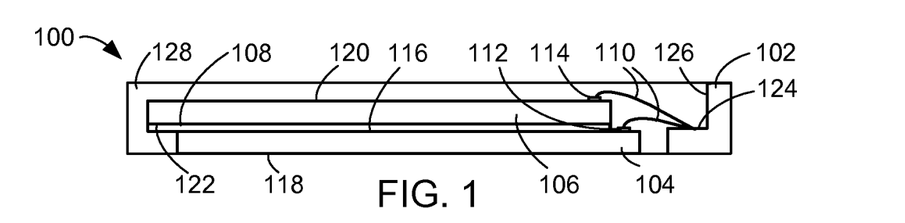
FIG. 1 is a cross-sectional view, taken from FIG. 4 along a line segment 1-1, of an integrated circuit package system in an embodiment of the present invention.

Referring now to FIG. 1, therein is shown a cross-sectional view of an integrated circuit package system 100 in an embodiment of the present invention. The integrated circuit package system 100 preferably includes L-shaped leadfingers 102, a first integrated circuit die 104, and second integrated circuit die 106. The L-shaped leadfingers 102 can be formed as a single in-line package (SIP) and optionally processed, such as a half-etch. The second integrated circuit die 106 can be mounted over the first integrated circuit die 104 with an attach layer 108. The second integrated circuit die 106 can be attached having an overhang of or offset from the first integrated circuit die 104 providing spacing for electrical connectors 110, such as bond wires, and substantially exposing first die pads 112, such as bond pads, of the first integrated circuit die 104 and second die pads 114 of the second integrated circuit die 106.

The first integrated circuit die 104 includes a first die active surface 116 and a first die back surface 118. The first die active surface 116 can include the first die pads 112 as well as active circuitry. Similarly, the second integrated circuit die 106 includes a second die active surface 120 and a second die back surface 122. The second die active surface 120 can include the second die pads 114 as well as active circuitry. The integrated circuit package system 100 can include the first die active surface 116 facing the second die back surface 122 providing the first die pads 112 substantially exposed adjacent to the second integrated circuit die 106. The second die pads 114 can be substantially exposed on the second die active surface 120 opposite the first integrated circuit die 104.

The first integrated circuit die 104 can be electrically connected to a horizontal inner lead surface 124 of the L-shaped leadfingers 102 by the electrical connectors 110. The horizontal inner lead surface 124 is adjacent to a vertical inner lead surface 126 of the L-shaped leadfingers 102. An encapsulant 128, such as an epoxy mold compound, can be formed over the electrical connectors 110, the first integrated circuit die 104, the second integrated circuit die 106, and the L-shaped leadfingers 102. The encapsulant 128 can be applied with a process, such as molding, to protect the integrated circuit package system 100 during further processing, such as stacking the integrated circuit package system 100 as a known good package (KGD) over another package. An aspect of the embodiments provides an extremely thin profile of the integrated circuit package system 100.

Figure 2:
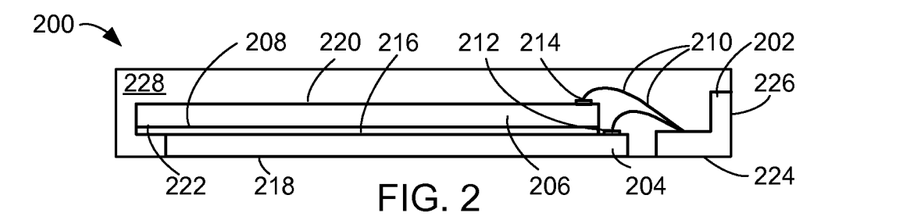
FIG. 2 a cross-sectional view of an integrated circuit package system in an alternative embodiment of the present invention.

Referring now to FIG. 2 therein is shown a cross-sectional view of an integrated circuit package system 200 in an alternative embodiment of the present invention. In a manner similar to the integrated circuit package system 100, the integrated circuit package system 200 can include L-shaped leadfingers 202. The L-shaped leadfingers 202 can be formed as a single in-line package (SIP) and optionally processed, such as a half-etch. The L-shaped leadfingers 202 can provide electrical connectivity for a first integrated circuit die 204 and a second integrated circuit die 206. An attach layer 208 can be applied between the first integrated circuit die 204 and the second integrated circuit die 206. The attach layer 208 can provide electrical isolation or protection for the first integrated circuit die 204 or the second integrated circuit die 206.

The first integrated circuit die 204 includes a first die active surface 216 and a first die back surface 218. The first die active surface 216 can include first die pads 212 as well as active circuitry. Similarly, the second integrated circuit die 206 includes a second die active surface 220 and a second die back surface 222. The second die active surface 220 can include second die pads 214 as well as active circuitry. The integrated circuit package system 200 can include the first die active surface 216 facing the second die back surface 222 providing the first die pads 212 substantially exposed adjacent to the second integrated circuit die 206. The second die pads 214 can be substantially exposed on the second die active surface 220 opposite the first integrated circuit die 204.

The second integrated circuit die 206 can be attached having an overhang of or an offset from the first integrated circuit die 204 providing spacing for electrical connectors 210, such as bond wires, and substantially exposing the first die pads 212, such as bond pads, and the second die pads 214, such as bond pads. The electrical connectors 210, such as bond wires can connect the first die pads 212 of the first integrated circuit die 204 to the L-shaped leadfingers 202. Similarly, the second integrated circuit die 206 can be electrically connected by the second die pads 214 connected to the L-shaped leadfingers 202 with the electrical connectors 210.

An encapsulant 228, such as an epoxy mold compound, can be formed over the electrical connectors 210, the first integrated circuit die 204, the second integrated circuit die 206 and the L-shaped leadfingers 202. The L-shaped leadfingers 202 can be substantially exposed on a lower lead surface 224 and an outer lead edge 226. The encapsulant 228 can be applied with a process, such as molding, to protect the integrated circuit package system 200 during further processing, such as stacking the integrated circuit package system 200 as a known good package (KGD) over another package.

Figure 3:
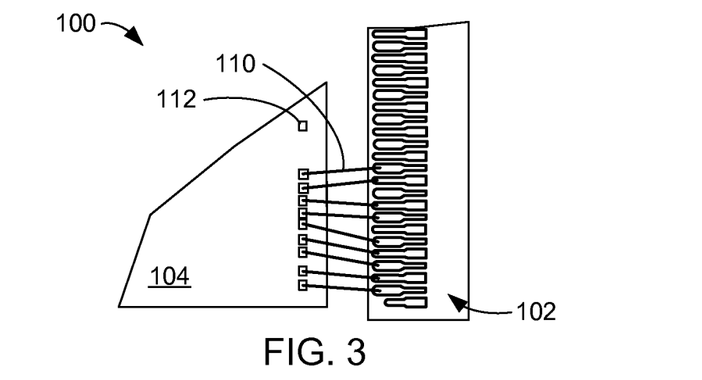
FIG. 3 is a top plan view of the integrated circuit package system.

Referring now to FIG. 3, therein is shown a top plan view of the integrated circuit package system 100. The integrated circuit package system 100 can include a leadframe (not shown), such as copper (Cu) alloy or a nickel/palladium (Ni/Pd) leadframe, having the L-shaped leadfingers 102. The leadframe can be preferably formed to a thickness of about 0.15 mm or 0.13 mm. The integrated circuit package system 100 includes the electrical connectors 110 between a portion of the first integrated circuit die 104 of FIG. 1 and a portion of the L-shaped leadfingers 102 as well as between a portion of the second integrated circuit die 106 and a portion of the L-shaped leadfingers 102.

The L-shaped leadfingers 102 can be limited in count or quantity by package size. The first die pads 112 can be provided on the first die active surface 116 of the first integrated circuit die 104 for attachment of the electrical connectors 110. The electrical connectors 110 can be connected between the L-shaped leadfingers 102 and the first die pads 112 as well as between the L-shaped leadfingers 102 and the second die pads 114. An aspect of the embodiments provides a 0.20 mm thick profile for a same die stack with the device having one set of the first die pads 112 or the second die pads 114. Another aspect of the embodiments is that the integrated circuit package system 100 provides a lowest cost solution.

Figure 4:
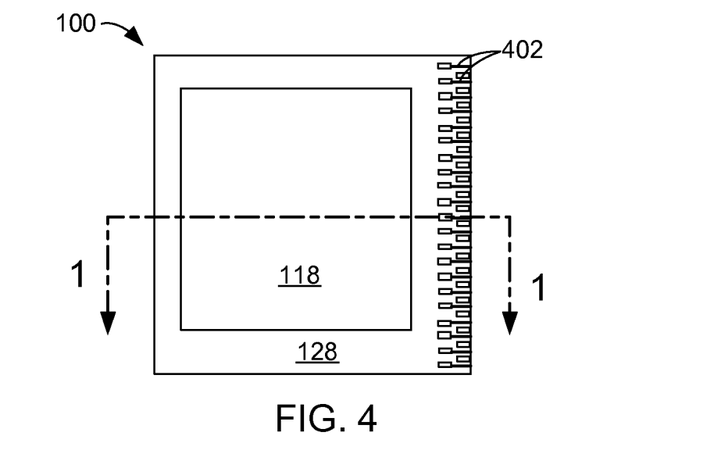
FIG. 4 is a bottom plan view of the integrated circuit package system.

Referring now to FIG. 4, therein is shown a bottom plan view of the integrated circuit package system 100. The integrated circuit package system 100 can include lands 402 of the L-shaped leadfingers 102 of FIG. 1. Etching of the L-shaped leadfingers 102, such as copper (Cu) alloy leadfingers, can form the lands 402. The lands 402 can be formed in a single row, a dual row or multiple rows to a pitch, such as 0.5 mm pitch or less. The lands 402 and the first die back surface 118 can be substantially exposed in a bottom package surface 404 of the integrated circuit package system 100.

The encapsulant 128 can preferably provide the first integrated circuit die 104 and the lands 402 substantially exposed. The first integrated circuit die 104 as well as the lands 402 can provide thermal surfaces for conduction or convection. Further, the substantially exposed surfaces of the first integrated circuit die 104 as well as the lands 402 can also provide electrical connectivity for electrical signals including power and ground.

Figure 5:
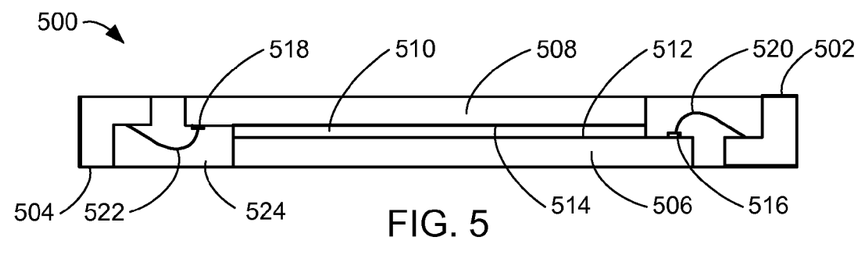
FIG. 5 is a cross-sectional view of an integrated circuit package system in another alternative embodiment of the present invention.

Referring now to FIG. 5, therein is shown a cross-sectional view of an integrated circuit package system 500 in another alternative embodiment of the present invention. The integrated circuit package system 500 includes first L-shaped leadfingers 502 and second L-shaped leadfingers 504. The first L-shaped leadfingers 502 can provide electrical connectivity for a first integrated circuit die 506 and the second L-shaped leadfingers 504 provide electrical connectivity for a second integrated circuit die 508. An attach layer 510 can be applied between a first die active surface 512 of the first integrated circuit die 506 and a second die active surface 514 of the second integrated circuit die 508. The first die active surface 512 can include first die pads 516 for electrically connecting the first integrated circuit die 506. The second die active surface 514 can include second die pads 518 for electrically connecting the second integrated circuit die 508.

The first die pads 516 can be electrically connected to the first L-shaped leadfingers 502 by first electrical connectors 520, such as bond wires. Similarly, the second die pads 518 can be electrically connected to the second L-shaped leadfingers 504 by second electrical connectors 522, such as bond wires. An encapsulant 524, such as an epoxy mold compound, can be formed over the first electrical connectors 520, the second electrical connectors 522, the first integrated circuit die 506, the second integrated circuit die 508 and the second L-shaped leadfingers 504. The encapsulant 524 can be applied with a process, such as molding, to protect the integrated circuit package system 500 during further processing, such as stacking the integrated circuit package system 500 as a known good package (KGP) over another package.

Figure 6:
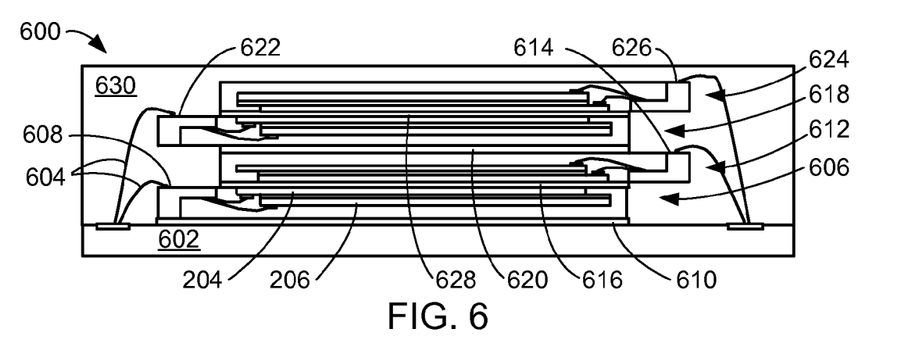
FIG. 6 is a cross-sectional view of package stacking with the integrated circuit package system of FIG. 1 or 2 using wire interconnection in another alternative embodiment of the present invention.

Referring now to FIG. 6, therein is shown a cross-sectional view of package stacking with the integrated circuit package system of FIG. 1 or 2 using wire connections in another alternative embodiment of the present invention. An integrated circuit package system 600 includes two or more of the integrated circuit package system 100 as known good packages (KGP). Each of the integrated circuit package system 100 can be validated, such as testing, providing a KGP in a stacked package improving final package yield. The first integrated circuit die 104 and the second integrated circuit die 106 can be substantially the same providing high density functions, such as four, eight, or more high density memory die.

The integrated circuit package system 600 can also include a base substrate 602 and electrical connectors 604, such as wire bonds.

A first package 606, such as the integrated circuit package system 100, can include first lands 608, such as single in-line lands, for electrically connecting the first package 606 to the base substrate 602. The first lands 608 can also provide testing of the first package 606. The first package 606 can be attached over the base substrate 602 with a first attach layer 610, such as an adhesive layer.

In a manner similar to the first package 606, a second package 612, such as the integrated circuit package system 100, can include second lands 614, such as single in-line lands, for electrically connecting the second package 612 to the base substrate 602. The second lands 614 can also provide testing of the second package 612. The second package 612 can be attached over the first package 606 with a second attach layer 616, such as an adhesive layer. The second package 612 can provide an overhang or offset substantially exposing the first lands 608 to provide spacing for the electrical connectors 604.

Similar to the first package 606 and the second package 612, a third package 618, such as the integrated circuit package system 100, can include third lands 620, such as single in-line lands, for electrically connecting the third package 618 to the base substrate 602. The third lands 620 can also provide testing of the third package 618. The third package 618 can be attached over the second package 612 with a third attach layer 622, such as an adhesive layer. The third package 618 can provide an overhang or offset substantially exposing the second lands 614 to provide spacing for the electrical connectors 604.

Similarly, a fourth package 624, such as the integrated circuit package system 100, can include fourth lands 626, such as single in-line lands, for electrically connecting the fourth package 624 to the base substrate 602. The fourth lands 626 can also provide testing of the fourth package 624. The fourth package 624 can be attached over the third package 618 with a fourth attach layer 628, such as an adhesive layer. The fourth package 624 can provide an overhang or offset substantially exposing the third lands 620 to provide spacing for the electrical connectors 604.

The base substrate 602 provides integration of the first package 606, the second package 612, the third package 618, and the fourth package 624 in the z-dimension with interconnection on both sides of the base substrate 602. An encapsulant 630 can be applied to provide structural integrity and protect the integrated circuit package system 600.

Figure 7:
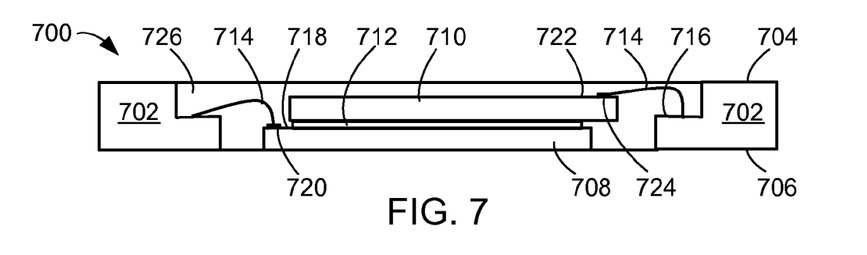
FIG. 7 is a cross-sectional view of an integrated circuit package system in another alternative embodiment of the present invention.

Referring now to FIG. 7, therein is shown a cross-sectional view of an integrated circuit package system 700 in another alternative embodiment of the present invention. The integrated circuit package system 700 includes L-shaped leadfingers 702. The L-shaped leadfingers 702 can be formed with a process, such as a half-etch, with a top lead surface 704 and a bottom lead surface 706. A first integrated circuit die 708 can be placed adjacent to the L-shaped leadfingers 202 over a leadframe (not shown), such as a film attached leadframe. A second integrated circuit die 710 can be attached over the first integrated circuit die 708 with an attach layer 712.

Electrical connectors 714 can connect the first integrated circuit die 708 and the second integrated circuit die 710 to a connection surface 716 of the L-shaped leadfingers 702. The first integrated circuit die 708 can include a first active surface 718 having first die pads 720 for electrical connection of the electrical connectors 714. Similarly, the second integrated circuit die 710 can include a second active surface 722 having second die pads 724 for electrical connection of the electrical connectors 714.

An encapsulant 726 can be applied, such as a vacuum mold or a top gate mold, over the first integrated circuit die 708, the second integrated circuit die 710, and the electrical connectors 714. The integrated circuit package system 700 can be formed as a quad flat no-lead (QFN) having the top lead surface 704 and the bottom lead surface 706 substantially exposed from the encapsulant 726. An overall thickness of the integrated circuit package system 700 can be reduced by processing, such as die thinning and loop height control.

Figure 8:
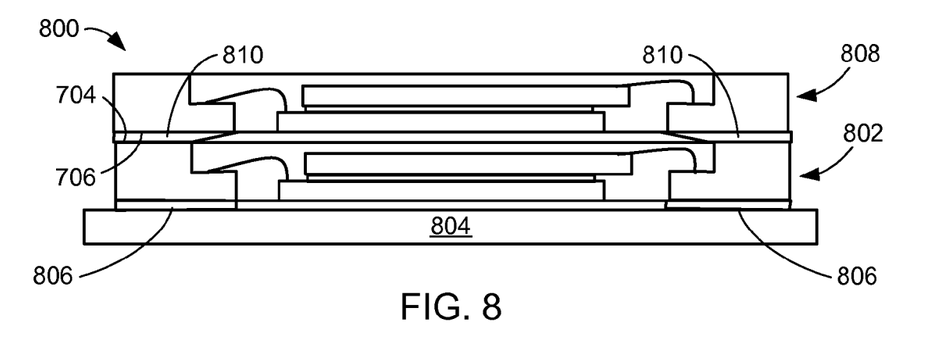
FIG. 8 is a cross-sectional view of package stacking with the integrated circuit package system of FIG. 7 using solder paste or conductive material in another alternative embodiment of the present invention.

Referring now to FIG. 8, therein is shown a cross-sectional view of package stacking with the integrated circuit package system of FIG. 7 using solder paste or conductive material in another alternative embodiment of the present invention. An integrated circuit package system 800 includes two or more of the integrated circuit package system 700 of FIG. 7. A first package 802, such as the integrated circuit package system 700, can be mounted over a base substrate 804, such as a mother board, with a first attach layer 806, such as a solder paste or conductive material. A second package 808, such as the integrated circuit package system 700, can be stacked over the first package 802 with a second attach layer 810, such as a solder paste or conductive material. The second attach layer 810 can provide an electrical connection between the top lead surface 704 of the first package 802 and the bottom lead surface 706 of the second package 808.

Figure 9:
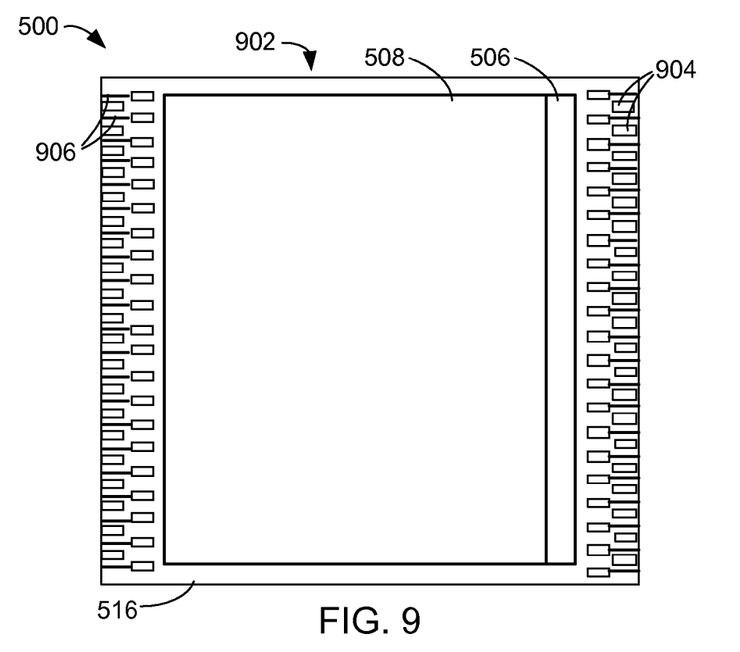
FIG. 9 is a top plan view of the integrated circuit package system.

Referring now to FIG. 9, therein is shown a top plan view of the integrated circuit package system 500. The integrated circuit package system 500 can be formed as a dual in-line package. A package top side 902 includes the encapsulant 524 having a backside, such as an inactive side, of the second integrated circuit die 508 substantially exposed. The first L-shaped leadfingers 502 or the second L-shaped leadfingers 504 can be formed with a process, such as a half-etching. A portion of the first L-shaped leadfingers 502 of FIG. 5 is also exposed as first top lands 904. Similarly, a portion of the second L-shaped leadfingers 504 of FIG. 5 is also exposed as second top lands 906.

The integrated circuit package system 500 can include a leadframe (not shown), such as copper (Cu) alloy or a nickel/palladium (Ni/Pd) leadframe, with the first L-shaped leadfingers 502 and the second L-shaped leadfingers 504. An aspect of the embodiments provides an extremely thin profile of the integrated circuit package system 500. Another aspect of the embodiments is that the integrated circuit package system 500 provides a lowest cost solution.

Figure 10:
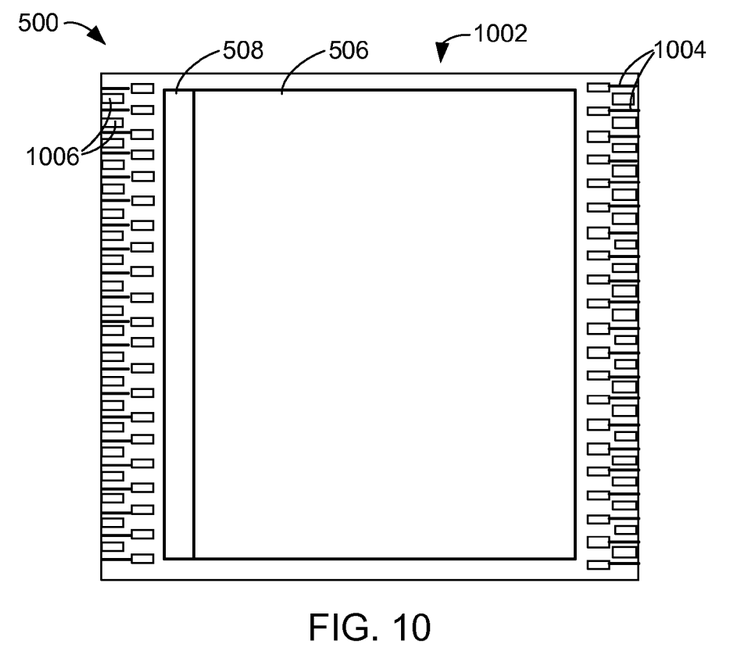
FIG. 10 is a bottom plan view of the integrated circuit package system.

Referring now to FIG. 10, therein is shown a bottom plan view of the integrated circuit package system 500. A package bottom side 1002 includes the encapsulant 524 having a backside, such as an inactive side, of the first integrated circuit die 506 substantially exposed. A portion of the first L-shaped leadfingers 502 is also exposed as first bottom lands 1004. Similarly, a portion of the second L-shaped leadfingers 504 is also exposed as second bottom lands 1006. The first bottom lands 1004 and the second bottom lands 1006 can be formed in a single row, a dual row or multiple rows.

As an example, the first integrated circuit die 506, and the second integrated circuit die 508 of FIG. 5 can be stacked to provide know good packages (KGP) for high density functions, such as high density memory. The integrated circuit package system 500 can provide a 0.20 mm thick profile for a die stack having the first integrated circuit die 506 and the second integrated circuit die 508. The first integrated circuit die 506 and the second integrated circuit die 508 can be substantially the same or different.

Figure 11:
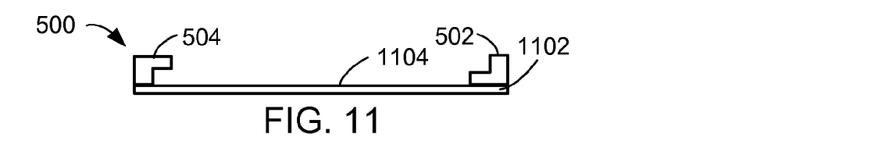
FIG. 11 is a cross-sectional view of the integrated circuit package system in a first coverlay attach phase.

Referring now to FIG. 11, therein is shown a cross-sectional view of the integrated circuit package system 500 in a first coverlay attach phase. A leadframe (not shown) having the first L-shaped leadfingers 502 and the second L-shaped leadfingers 504 is attached over a first coverlay film 1102 having a first coverlay mounting surface 1104. The first coverlay mounting surface 1104 can provide an attachment surface, such as an adhesive surface or a surface for an adhesive. The first coverlay film 1102 provides structural integrity to the leadframe and a substantially planar surface between the first L-shaped leadfingers 502 and the second L-shaped leadfingers 504.

Figure 12:
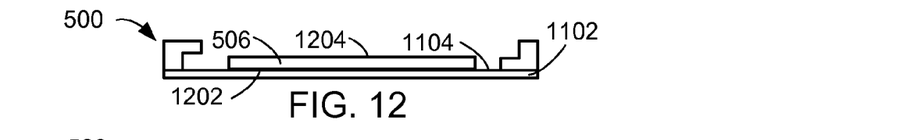
FIG. 12 is the structure of FIG. 1 in a first die attach phase.

Referring now to FIG. 12, therein is shown the structure of FIG. 11 in a first die attach phase. The first integrated circuit die 506 can be attached over the first coverlay film 1102. A first die backside surface 1202 of the first integrated circuit die 506 faces the first coverlay mounting surface 1104 of the first coverlay film 1102. A first die connection surface 1204 of the first integrated circuit die 506 is on a side opposite the first die backside surface 1202 and the first coverlay mounting surface 1104.

Figure 13:
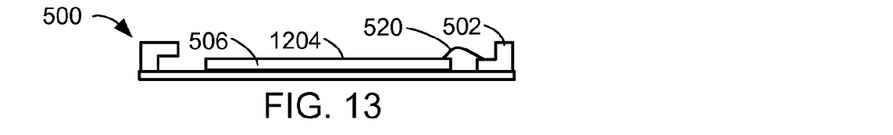
FIG. 13 is the structure of FIG. 12 in a first die connect phase.

Referring now to FIG. 13, therein is shown the structure of FIG. 12 in a first die connect phase. The first integrated circuit die 506 can be electrically connected to the first L-shaped leadfingers 502. The first electrical connectors 520 can be formed between the first die connection surface 1204 of the first integrated circuit die 506 and the first L-shaped leadfingers 502. The first electrical connectors 520 can provide discrete connectivity from the first integrated circuit die 506 to the first L-shaped leadfingers 502, and a next level system, such as another package or a printed circuit board.

Figure 14:
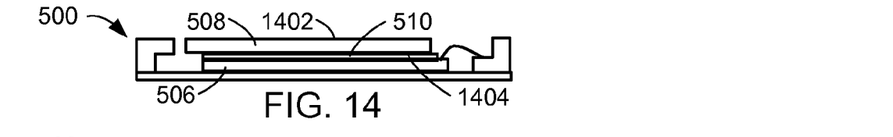
FIG. 14 is the structure of FIG. 13 in a second die attach phase.

Referring now to FIG. 14, therein is shown the structure of FIG. 13 in a second die attach phase. The second integrated circuit die 508 can be attached over the first integrated circuit die 506 with the attach layer 510. A second die backside surface 1402 of the second integrated circuit die 508 faces the first integrated circuit die 506. A second die connection surface 1404 of the second integrated circuit die 508 is on a side opposite the second die backside surface 1402 and the first integrated circuit die 506.

Figure 15:
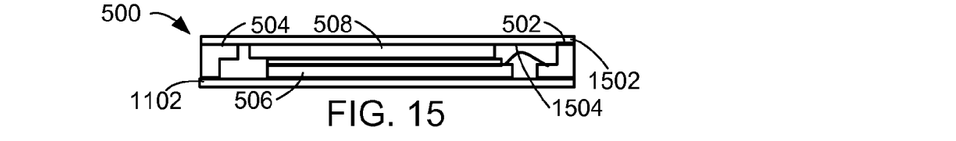
FIG. 15 is the structure of FIG. 14 in a second coverlay attach phase.

Referring now to FIG. 15, therein is shown the structure of FIG. 14 in a second coverlay attach phase. A second coverlay film 1502 having a second coverlay mounting surface 1504 is attached to the second integrated circuit die 508, the first L-shaped leadfingers 502, and the second L-shaped leadfingers 504, on a side opposite the first coverlay film 1102. The second coverlay film 1502 provides structural integrity to the first L-shaped leadfingers 502 and the second L-shaped leadfingers 504, the first integrated circuit die 506, and the second integrated circuit die 508.

Figure 16:
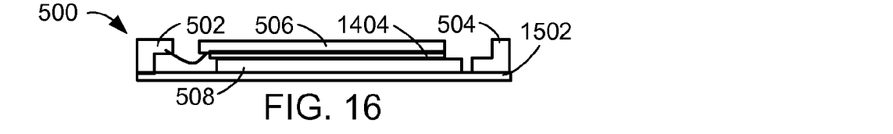
FIG. 16 is the structure of FIG. 15 in a first detape and turn over phase.

Referring now to FIG. 16, therein is shown the structure of FIG. 15 in a first detape and turn over phase. The first coverlay film 1102 can be removed from the first integrated circuit die 506, the first L-shaped leadfingers 502, and the second L-shaped leadfingers 504. The integrated circuit package system 500 can be turned over having the first integrated circuit die 506 over the second integrated circuit die 508. A portion of the second die connection surface 1404 and the second L-shaped leadfingers 504 can be exposed for further processing.

Figure 17:
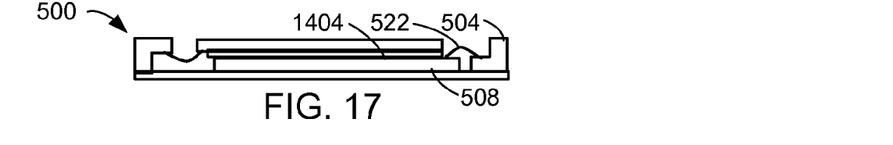
FIG. 17 is the structure of FIG. 16 in a second die connect phase.

Referring now to FIG. 17, therein is shown the structure of FIG. 16 in a second die connect phase. The second integrated circuit die 508 can be electrically connected to the second L-shaped leadfingers 504. The second electrical connectors 522 can be formed between the second die connection surface 1404 of the second integrated circuit die 508 and the second L-shaped leadfingers 504. The second electrical connectors 522 can provide discrete connectivity from the second integrated circuit die 508 to the second L-shaped leadfingers 504, and a next level system, such as another package or a printed circuit board.

Figure 18:
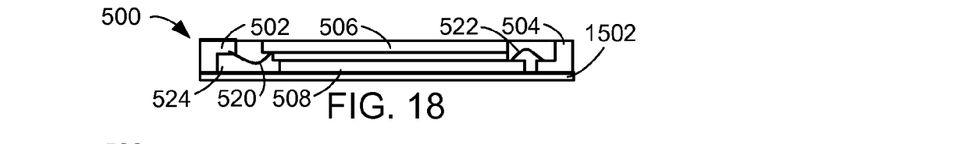
FIG. 18 is the structure of FIG. 17 in a mold and plastic mold compound (PMC) phase.

Referring now to FIG. 18, therein is shown the structure of FIG. 17 in a mold and plastic mold compound (PMC) phase. The first integrated circuit die 506, the second integrated circuit die 508, the first L-shaped leadfingers 502, the second L-shaped leadfingers 504, the first electrical connectors 520, and the second electrical connectors 522, over the second coverlay film 1502, can be encapsulated. The second coverlay film 1502 provides structural integrity to the integrated circuit package system 500 during an encapsulation process.

Figure 19:
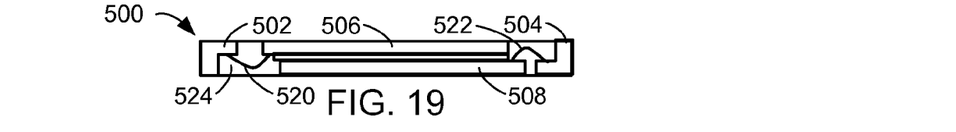
FIG. 19 is the structure of FIG. 18 in a second detape phase.

Referring now to FIG. 19, therein is shown the structure of FIG. 18 in a second detape phase. The encapsulant 524 provides structural integrity and protection to the first integrated circuit die 506, the second integrated circuit die 508, the first L-shaped leadfingers 502, the second L-shaped leadfingers 504, the first electrical connectors 520, and the second electrical connectors 522. The second coverlay film 1502 can be removed from the second integrated circuit die 508, the first L-shaped leadfingers 502, the second L-shaped leadfingers 504, and the encapsulant 524.

Figure 20:
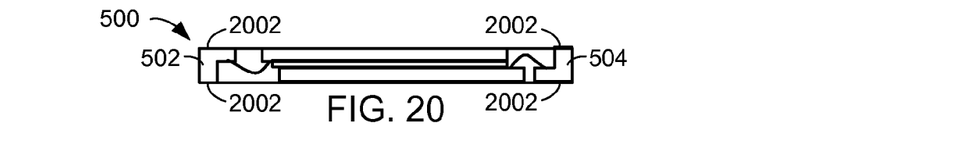
FIG. 20 is the structure of FIG. 19 in an optional plating and singulation phase.

Referring now to FIG. 20, therein is shown the structure of FIG. 19 in an optional plating and singulation phase. The first L-shaped leadfingers 502 and the second L-shaped leadfingers 504 can include exposed surfaces 2002. A portion of the exposed surfaces 2002 can be plated to improve connectivity, such as soldering or wire bonding. The integrated circuit package system 500 can also be formed in a matrix (not shown) having multiple instantiations of the integrated circuit package system 500. Each of the integrated circuit package system 500 can be singulated as individual packages for a next level system.

Figure 21:
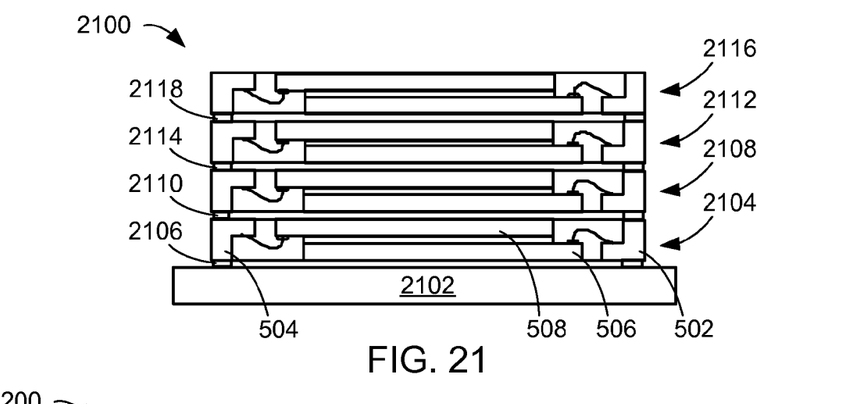
FIG. 21 is a cross-sectional view of package stacking with the integrated circuit package system of FIG. 5 in another alternative embodiment of the present invention.

Referring now to FIG. 21, therein is shown a cross-sectional view of package stacking with the integrated circuit package system of FIG. 5 in another alternative embodiment of the present invention. An integrated circuit package system 2100 includes two or more of the integrated circuit package system 500 of FIG. 5 integrated in a z-dimension. The integrated circuit package system 2100 can also include a base substrate 2102. The integrated circuit package system 2100 provides known good packages (KGP) having a thin profile for high density, such as high density memory, and to improve final package yield. Multiple integrated circuit die, such as the first integrated circuit die 506 or the second integrated circuit die 508, can be stacked with four, eight or more.

The integrated circuit package system 500 includes the first top lands 904 of FIG. 9 of the first L-shaped leadfingers 502, the second top lands 906 of FIG. 9 of the second L-shaped leadfingers 504. The integrated circuit package system 500 also includes the first bottom lands 1004 of FIG. 10 of the first L-shaped leadfingers 502 and the second bottom lands 1006 of FIG. 10 of the second L-shaped leadfingers 504. The first top lands 904 and the second top lands 906 of one of the integrated circuit package system 500 can be electrically connected to the first bottom lands 1004 and the second bottom lands 1006 of another of the integrated circuit package system 500.

A first package 2104, such as the integrated circuit package system 500, can be mounted over the base substrate 2102 with a first attach layer 2106, such as a solder paste or conductive material. A second package 2108, such as the integrated circuit package system 500, can be stacked over the first package 2104 with a second attach layer 2110, such as a solder paste or conductive material. A third package 2112, such as the integrated circuit package system 500, can be stacked over the second package 2108 with a third attach layer 2114, such as a solder paste or conductive material. A fourth package 2116, such as the integrated circuit package system 500, can be mounted over the third package 2112 with a fourth attach layer 2118, such as a solder paste or conductive material. The first attach layer 2106, the second attach layer 2110, the third attach layer 2114, and the fourth attach layer 2118 can provide electrical connectivity.

Figure 22:
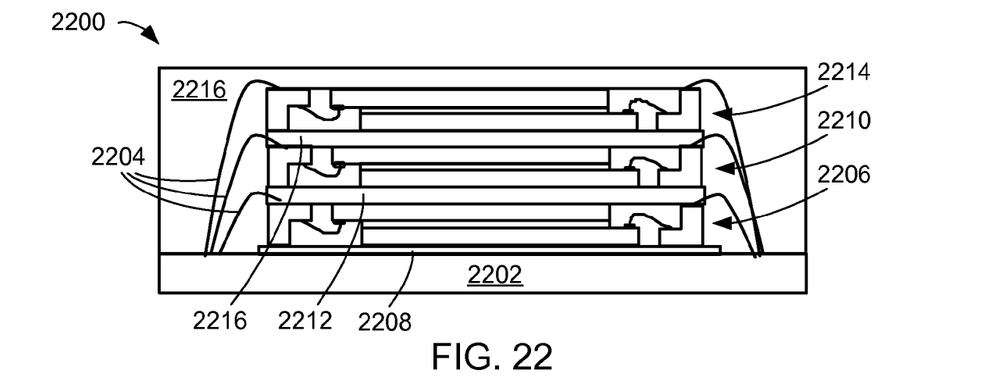
FIG. 22 is a cross-sectional view of package stacking with the integrated circuit package system of FIG. 20 using wire interconnection in another alternative embodiment of the present invention.

Referring now to FIG. 22, therein is shown a cross-sectional view of package stacking with the integrated circuit package system of FIG. 20 using wire interconnection in another alternative embodiment of the present invention. An integrated circuit package system 2200 includes two or more of the integrated circuit package system 500 of FIG. 20, integrated in a z-dimension. One or more integrated circuit die can be stacked in a known good package (KGP), such as the integrated circuit package system 500. The integrated circuit package system 2200 can also include a base substrate 2202 and package connectors 2204. The first L-shaped leadfingers 502 and the second L-shaped leadfingers 504 can be formed having the first top lands 904 of FIG. 9 and the second top lands 906 of FIG. 9 as dual in-line lands. In a similar manner, the first bottom lands 1004 of FIG. 10 and the second bottom lands 1006 of FIG. 10 can also be formed as dual in-line lands.

A first package 2206, such as the integrated circuit package system 500, can be mounted over the base substrate 2202 with a first attach layer 2208, such as an adhesive. The package connectors 2204 can connect the first top lands 904 and the second top lands 906 of the first package 2206 to both sides of the base substrate 2202.

A second package 2210, such as the integrated circuit package system 500, can be stacked over the first package 2206 with a second attach layer 2212, such as a spacer or an adhesive. The package connectors 2204 can connect the first top lands 904 and the second top lands 906 of the second package 2210 to both sides of the base substrate 2202.

A third package 2214, such as the integrated circuit package system 500, can be stacked over the second package 2210 with a third attach layer 2216, such as a spacer or an adhesive. The package connectors 2204 can connect the first top lands 904 and the second top lands 906 of the third package 2214 to both sides of the base substrate 2202.

An encapsulant 2218 can be formed over the first package 2206, the second package 2210, the third package 2214, the package connectors 2204, and the base substrate 2202. The encapsulant 2218, such as an epoxy mold compound, provides structural integrity and protection of the integrated circuit package system 2200.

Figure 23:
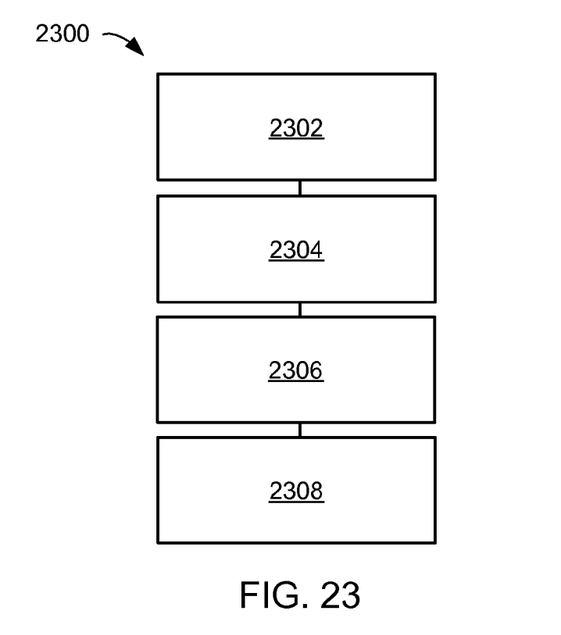
FIG. 23 is a flow chart of an integrated circuit package system for manufacturing the integrated circuit package system in an embodiment of the present invention.

Referring now to FIG. 23, therein is shown a flow chart of an integrated circuit package system 2300 for manufacturing the integrated circuit package system 100 in an embodiment of the present invention. The system 2300 includes providing a first integrated circuit die having die pads only adjacent a single edge of the first integrated circuit die in a block 2302; forming first L-shaped leadfingers adjacent the single edge in a block 2304; connecting the die pads and the first L-shaped leadfingers in a block 2306; and encapsulating the die pads and portions of the first L-shaped leadfingers to form a first package in a block 2308.

In greater detail, a system to provide the method and apparatus of the integrated circuit package system 100, in an embodiment of the present invention, is performed as follows:

1. Forming a first integrated circuit die having die pads on a first die active surface only adjacent a single edge of the first integrated circuit die.
2. Forming a leadframe having first L-shaped leadfingers adjacent the single edge.
3. Electrically connecting the die pads to the first L-shaped leadfingers.
4. Encapsulating a portion of the first integrated circuit die, the die pads, and portions of the first L-shaped leadfingers to form a first package.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing of an integrated circuit package system comprising:
   providing a first integrated circuit die having die pads only adjacent a single edge of the first integrated circuit die;
   forming first L-shaped leadfingers adjacent the single edge, the first L-shaped leadfingers having a first upper surface;
   connecting the die pads and the first L-shaped leadfingers;
   attaching a second integrated circuit die over the first integrated circuit die;
   forming second L-shaped leadfingers adjacent the second integrated circuit die, the second L-shaped leadfingers having a second upper surface;
   connecting the second integrated circuit die to the second L-shaped leadfingers; and
   encapsulating the die pads and the first integrated circuit die and the second integrated circuit die and a portion of the first L-shaped leadfingers and a portion of the second L-shaped leadfingers to form a first package, wherein the encapsulating step exposes the first upper surface and the second upper surface, the second upper surface being greater than the first upper surface.

2. The method as claimed in claim 1 wherein:
   the second integrated circuit die includes second die pads only adjacent a single edge of the second integrated circuit die;
   attaching the second integrated circuit die over the first integrated circuit die having the die pads of the first integrated circuit die exposed;
   forming the second L-shaped leadfingers adjacent the single edge of the second integrated circuit die; and
   connecting the second die pads and the second L-shaped leadfingers.

3. The method as claimed in claim 1 wherein:
   the second integrated circuit die includes second die pads only adjacent a single edge of the second integrated circuit die;
   attaching the second integrated circuit die over the first integrated circuit die with the die pads of the first integrated circuit die exposed;

forming the second L-shaped leadfingers adjacent the single edge of the second integrated circuit die and intermixed with the first L-shaped leadfingers; and connecting the second die pads and the second L-shaped leadfingers.

4. The method as claimed in claim 1 further comprising:

providing a third integrated circuit die having third die pads only adjacent a single edge of the third integrated circuit die;

forming third L-shaped leadfingers adjacent the single edge of the third integrated circuit die;

connecting the third die pads and the third L-shaped leadfingers;

encapsulating the third die pads and portions of the third L-shaped leadfingers to form a second package; and stacking the second package over the first package with the third L-shaped leadfingers electrically connected to at least one of the first L-shaped leadfingers and the second L-shaped leadfingers.

5. The method as claimed in claim 4 further comprising:

providing a base substrate; and electrically connecting at least one of the first L-shaped leadfingers and the second L-shaped leadfingers and the third L-shaped leadfingers to the base substrate.

6. A method for manufacturing of an integrated circuit package system comprising:

forming a first integrated circuit die having die pads on a first die active surface only adjacent a single edge of the first integrated circuit die;

forming a first leadframe having first L-shaped leadfingers adjacent the single edge, the first L-shaped leadfingers having a first upper surface;

electrically connecting the die pads to the first L-shaped leadfingers;

providing a second integrated circuit die;

attaching the second integrated circuit die over the first integrated circuit die;

forming a second leadframe having second L-shaped leadfingers adjacent the second integrated circuit die, the second L-shaped leadfingers having a second upper surface;

electrically connecting the second integrated circuit die to the second L-shaped leadfingers; and encapsulating a portion of the first integrated circuit die, the die pads, the second integrated circuit die, and portions of the first L-shaped leadfingers and the second L-shaped leadfingers to form a first package, wherein the encapsulating step exposes the first upper surface and the second upper surface, the second upper surface being greater than the first upper surface.

7. The method as claimed in claim 6 wherein:

the second integrated circuit die includes a second die back surface; and attaching the second die back surface over the first die active surface, the second integrated circuit die having an offset from the first integrated circuit die with the die pads exposed adjacent the second integrated circuit die.

8. The method as claimed in claim 6 wherein:

the second integrated circuit die includes second die pads and a second die active surface; and attaching the second die active surface over the first die active surface, the second integrated circuit die having an offset from the first integrated circuit die with the second die pads exposed adjacent the first integrated circuit die.

9. The method as claimed in claim 6 wherein:

the second integrated circuit die includes second die pads; and attaching the second integrated circuit die over the first integrated circuit die having the second die pads on a side opposite the die pads.

10. The method as claimed in claim 6 wherein:

the second integrated circuit die includes second die pads; and attaching the second integrated circuit die over the first integrated circuit die having the second die pads on the same side as the die pads.

11. An integrated circuit package system comprising:

a first integrated circuit die having die pads only adjacent a single edge of the first integrated circuit die;

first L-shaped leadfingers adjacent the single edge, the first L-shaped leadfingers having a first upper surface and connected to the die pads;

a second integrated circuit die over the first integrated circuit die;

second L-shaped leadfingers adjacent the second integrated circuit die, the second L-shaped leadfingers having a second upper surface and connected to the second integrated circuit die; and a first package having the die pads, the first integrated circuit, the second integrated circuit, and portions of the first L-shaped leadfingers and the second L-shaped leadfingers encapsulated leaving the first upper surface and the second upper surface exposed, the second upper surface being greater than the first upper surface.

12. The system as claimed in claim 11 wherein:

the second integrated circuit die includes second die pads only adjacent a single edge of the second integrated circuit die, the second integrated circuit die over the first integrated circuit die having the die pads exposed; and the second L-shaped leadfingers adjacent the single edge of the second integrated circuit die having the second die pad and the second L-shaped leadfingers connected.

13. The system as claimed in claim 11 wherein:

the second integrated circuit die having second die pads only adjacent a single edge of the second integrated circuit die, the second integrated circuit die over the first integrated circuit die with the die pads exposed; and the second L-shaped leadfingers adjacent the single edge of the second integrated circuit die and intermixed with the first L-shaped leadfingers, the second die pads and the second L-shaped leadfingers connected.

14. The system as claimed in claim 11 further comprising:

the second integrated circuit die having second die pads only adjacent a single edge of the second integrated circuit die;

the second L-shaped leadfingers adjacent the single edge of the second integrated circuit die having the second die pads and the second L-shaped leadfingers connected; and a second package stacked over the first package with the first L-shaped leadfingers and the second L-shaped leadfingers electrically connected.

15. The system as claimed in claim 14 further comprising:

a base substrate;

the second package stacked over the first package with at least one of the first L-shaped leadfingers and the second L-shaped leadfingers electrically connected to the base substrate.

16. The system as claimed in claim 11 wherein:

the first integrated circuit die is the first integrated circuit die having the die pads on a first die active surface only adjacent the single edge of the first integrated circuit die;

the first L-shaped leadfingers are part of a leadframe having the first L-shaped leadfingers adjacent the single edge.

17. The system as claimed in claim 16 wherein the second integrated circuit die includes a second die back surface over the first die active surface, the second integrated circuit die having an offset from the first integrated circuit die with the die pads exposed adjacent the second integrated circuit die.

18. The system as claimed in claim 16 wherein the second integrated circuit die includes second die pads and a second die active surface over the first die active surface, the second integrated circuit die having an offset of the first integrated circuit die with the second die pads exposed adjacent the first integrated circuit die.

19. The system as claimed in claim 16 wherein the second integrated circuit die includes second die pads, the second integrated circuit die over the first integrated circuit die having the second die pads on a side opposite the die pads.

20. The system as claimed in claim 16 wherein the second integrated circuit die includes second die pads, the second integrated circuit die over the first integrated circuit die having the second die pads on a same side as the die pads.

* * * * *